(12) United States Patent
Chung et al.

(10) Patent No.: US 6,677,055 B1
(45) Date of Patent: Jan. 13, 2004

(54) TAPE STRUCTURE AND MANUFACTURING METHOD

(75) Inventors: Chin-Fu Chung, Hsinchu (TW); Chih-Kung Huang, Yi-Lan (TW)

(73) Assignee: Kingtron Electronics Co., Ltd., Hsinchu (TW)

( * ) Notice: Subject to any disclaimer, the term of this patent is extended or adjusted under 35 U.S.C. 154(b) by 23 days.

(21) Appl. No.: 10/064,205

(22) Filed: Jun. 21, 2002

(30) Foreign Application Priority Data

May 29, 2002 (TW) ........................................ 91111435 A

(51) Int. Cl.⁷ .............................................. B32B 15/01
(52) U.S. Cl. ........................ 428/646; 428/626; 428/647; 428/929
(58) Field of Search .................................. 428/643, 644, 428/646, 647, 626, 929

(56) References Cited

U.S. PATENT DOCUMENTS

| 4,014,660 | A | * | 3/1977 | Schreiner et al. ........... 29/183.5 |
| 4,441,118 | A | * | 4/1984 | Fister et al. ................... 357/70 |
| 6,110,608 | A | * | 8/2000 | Tanimoto et al. ............ 428/647 |

* cited by examiner

*Primary Examiner*—Cathy Lam
(74) *Attorney, Agent, or Firm*—Jianq Chyun IP Office

(57) ABSTRACT

A tape structure and method of fabricating the tape structure. The method includes plating a metal such as silver, bismuth, gold, magnesium, nickel, or palladium over leads so that recess cavities and whiskers on the leads are greatly reduced.

6 Claims, 6 Drawing Sheets

TAPE STRUCTURE AND MANUFACTURING METHOD

CROSS REFERENCE TO RELATED APPLICATIONS

This application claims the priority benefit of Taiwan application serial no. 91111435, filed May 29, 2002.

BACKGROUND OF INVENTION

1. Field of Invention

The present invention relates to a tape structure and its manufacturing method. More particularly, the present invention relates to a tape structure and manufacturing method capable of preventing the formation of whiskers and recess cavities on lead surfaces.

2. Description of Related Art

In this information saturated society, multimedia applications are expanding quickly. To prepare for multimedia expansion, integrated circuit packages are increasingly digitized, networked, locally interconnected and personalized. Correspondingly, the electronic devices must have a high processing speed and serve multiple functions. In general, electronic devices are highly integrated, compact and easily mass-produced. In the past, most integrated circuit packages were fabricated using wire-bonding techniques. However, with an increase in the number of devices packed within a given package, all the devices within the package can no longer be properly linked together due to intrinsic limitations of the wire-bonding technique. Consequently, the tape automated bonding (TAB) technique has been developed. Since packages formed by the tape automated bonding (TAB) technique occupy a small volume and are relatively light and flexible, subsequent assembling and packaging are very much facilitated.

FIG. 1 is a sectional view of a conventional tape structure. The tape is formed on a film 100. The film 100 has a plurality of device holes 110. A solder mask 108 is formed on the film 100. A plurality of leads 102 is formed between the film 100 and the solder mask 108. Each lead 102 extends from the film 100 into the interior of the device hole 110. In general, the leads 102 are made from copper. The surface of each lead 102 has a metallic tin layer 106. However, the leads 102 and the film 100 as well as the leads 102 and the solder mask 108 are in direct contact and hence the junction between has no intermediate metallic tin layer 106. A tin-copper alloy layer 104 is formed between the metallic tin layer 106 and the leads 102.

FIG. 2 is a flow chart showing the steps for producing the tape as shown in FIG. 1. As shown in FIG. 2, the manufacturing process includes providing a film (200), forming the leads (202), coating a solder mask layer (204), tinning the leads (206) and baking (208).

To fabricate the tape structure, a film 100 is provided in step 200. The film 100 with a tape profile has a plurality of device holes 110 therein. Leads 102 are formed in step 202. To form the leads 102, a copper film is pressed onto the film 100 and patterned by conducting photolithographic and etching processes. A solder mask 108 is formed in step 204 by coating a layer of solder material over the film 100. The leads 102 are tinned in step 206. In the tinning operation, the exposed lead surface is electroplated to form a metallic tin layer 106. Finally, the assembly is baked in step 208 to form a tin-copper alloy layer 104 at the junction between the lead 102 and the metallic tin layer 106.

After the aforementioned tinning operation, a recess cavity may emerge on the surface of the leads 102 (details explained below) and whiskers may appear on the upper surface of the metallic tin layer 106.

FIG. 3 is a sectional view showing the emergence of a recess cavity in a conventional tape lead due to corrosion after a tinning operation. Since the edges of the solder mask 108 have a thickness smaller than the central region, the edges are more vulnerable to the corrosive attack by the tinning solution and hence are more likely to peel off from the leads 102. The peel-off area between the solder mask 108 and the lead 102 is then subjected to an oxidation-reduction reaction. In the oxidation-reduction reaction, the copper atoms on the lead 102 are oxidized into copper ions and dissolved in the tinning solution. Ultimately, a recess cavity 110 will appear on the surface of the lead 102. In the meantime, the electrons released from the copper atoms will reduce the tin ions in the tinning solution into metallic tin and adhere to the surface of the lead 102.

FIG. 4 is a sectional view of another conventional tape structure. The tape is formed on a film 300. The film 300 has a plurality of device holes 310. A solder mask 308 is formed on the film 300. A plurality of leads 302 is formed between the film 300 and the solder mask 308. Each lead 302 extends from the film 300 into the interior of the device hole 310. In general, the leads 302 are made from copper. The surface of each lead 302 has a metallic tin layer 306. However, the leads 302 and the film 300 are in direct contact and hence the junction between has no intermediate metallic tin layer 306. A tin-copper alloy layer 304 is formed between the metallic tin layer 306 and the leads 302. In other words, there is a tin-copper alloy layer (304) and a metallic tin layer (306) between the solder mask layer 308 and the lead 302.

FIG. 5 is a flow chart showing the steps for producing the tape as shown in FIG. 4. As shown in FIG. 4, the manufacturing process includes providing a film (400), forming the leads (402), tinning the leads (404), baking (406) and coating a solder mask layer (408).

To fabricate the tape structure, a film 300 is provided in step 400. The film 300 with a tape profile has a plurality of device holes 310 therein. Leads 302 are formed in step 402. To form the leads 302, a copper film is pressed onto the film 300 and patterned by conducting photolithographic and etching processes. The leads 302 are tinned in step 404. In the tinning operation, the exposed lead surface is electroplated to form a metallic tin layer 306 so that the leads 302 have a metallic tin layer thereon aside from the junction between the leads 302 and the film 300. The assembly is baked in step 406 to form a tin-copper alloy layer 304 at the junction between the lead 302 and the metallic tin layer 306. Finally, a solder mask 308 is formed in step 408 by coating a layer of solder material over the film 300.

Although the sequence of steps including lead tinning (404), baking (406) and solder mask coating is able to minimize the formation of recess cavities, whiskers still forms on the surface of the metallic tin layer 306.

FIG. 6 is a sectional view of yet another conventional tape structure. The tape is formed on a film 500. The film 500 has a plurality of device holes 510. A solder mask 508 is formed on the film 500. A plurality of leads 502 is formed between the film 500 and the solder mask 508. Each lead 502 extends from the film 500 into the interior of the device hole 510. In general, the leads 502 are made from copper. The surface of each lead 502 has a tin-copper alloy layer 504. However, the leads 502 and the film 500 are in direct contact and hence the junction between has no intermediate. tin-copper alloy layer

504. A metallic tin layer 506 is formed over the tin-copper alloy layer 504, but the junction interface between the tin-copper alloy layer 504 and the film 500 as well as between the tin-copper alloy layer 504 and the solder mask layer 508 has no metallic tin layer 506. In other words, there is a tin-copper alloy layer (504) between the lead 502 and the solder mask 508 but no metallic tin layer (506) therein.

FIG. 7 is a flow chart showing the steps for producing the tape as shown in FIG. 6. As shown in FIG. 6, the manufacturing process includes providing a film (600), forming the leads (602), conducting a first tinning operation (604), baking (606), coating a solder mask layer (608) and conducting a second tinning operation (610).

To fabricate the tape structure, a film 500 is provided in step 600. The film 500 with a tape profile has a plurality of device holes 510 therein. Leads 502 are formed in step 602. To form the leads 502, a copper film is pressed onto the film 500 and patterned by conducting photolithographic and etching processes. The leads 502 are tinned in step 604. In the first tinning operation, the exposed lead surface is electroplated to form a metallic tin layer so that the leads 502 have a metallic tin layer thereon aside from the junction between the leads 502 and the film 500. The assembly is baked in step 606 to form a tin-copper alloy layer 504 over the lead 502. A solder mask 508 is formed in step 608 by coating a layer of solder material over the film 500. Finally, a second tinning operation is carried out in step 610 to form a metallic tin layer 506 over the exposed surface of the tin-copper alloy layer 504.

The introduction of a second tinning operation in the aforementioned production process is able to minimize the probability of forming recess cavities on the leads 502 as well as whiskers on the surface of the metallic tin layer 506.

SUMMARY OF INVENTION

Accordingly, one object of the present invention is to provide a tape structure and fabrication method capable of preventing the formation whiskers and recess cavities on lead surfaces.

To achieve these and other advantages and in accordance with the purpose of the invention, as embodied and broadly described herein, the invention provides a tape structure. The tape structure comprises a film, a solder mask and a plurality of leads. The film has at least one device hole and a plurality of leads. The leads extend from the film to the interior of the device holes. The solder mask is formed on the film. The surface of the leads is covered with a tin-copper alloy layer, a tin-copper-first metal alloy layer and a metallic tin layer. The first metal includes silver, bismuth, gold, magnesium, nickel, or palladium, for example. In this invention, the tin-copper alloy layer is formed on the surface beyond the junction interface between the film and the leads. The tin-copper-first metal alloy is formed over the tin-copper alloy layer. The metallic tin layer is formed on the surface beyond the junction interface between the tin-copper-first metal alloy layer and the mask layer.

This invention also provides an alternative tape structure comprising a film, a solder mask and a plurality of leads. The film has at least one device hole and a plurality of leads. The leads extend from the film to the interior of the device holes. The solder mask is formed on the film. The surface of the leads has a copper-first metal alloy layer, a tin-copper-first metal alloy layer and a metallic tin layer. The first metal includes silver, bismuth, gold, magnesium, nickel, or palladium, for example. In this invention, the copper-first metal alloy layer is formed on the surface beyond the junction interface between the lead and the film. The tin-copper-first metal alloy layer is formed on the surface beyond the junction interface between the copper-first metal alloy layer and the solder mask layer. The metallic tin layer is formed over the tin-copper-first metal alloy layer.

In the aforementioned tape structure, the film is made from a material including polyimide and the solder mask layer is made from a material including epoxy resin, for example.

This invention also provides a method of fabricating a tape structure. A film having at least one device hole therein is provided. A plurality of leads is formed on the film. The leads are made from a material such as copper. Thereafter, a first metallic tin layer is formed on the surface of the leads (first tinning operation). A first metallic layer is formed on the surface of the first metallic tin layer. The first metallic layer is a silver, bismuth, gold, magnesium, nickel, or palladium layer, for example. A first baking operation is carried out to form a tin-copper alloy layer and a tin-copper-first metal alloy layer on the surface of the leads. A solder mask is formed over the film. A second metallic tin layer is formed on the surface of the tin-copper-first metal alloy layer. Finally, a second baking operation is carried out.

In the aforementioned method of fabricating a tape structure, the first metallic tin layer, the first metallic layer and the second metallic tin layer are formed, for example, by electroplating.

This invention also provides an alternative method of fabricating a tape structure. A film having at least one device hole therein is provided. A plurality of leads is formed on the film. The leads are made from a material such as copper. Thereafter, a first metallic layer is formed on the surface of the leads. The first metallic layer is a silver, bismuth, gold, magnesium, nickel, or palladium layer, for example. A first baking operation is carried out to form a copper-first metal alloy layer on the surface of the leads. A solder mask is formed over the film. A metallic tin layer is formed on the surface of the copper-first metal alloy layer. Finally, a second baking operation is carried out to form a tin-copper-first metal alloy layer between the copper-first metal alloy layer and the metallic tin layer.

In the aforementioned method of fabricating a tape structure, the first metallic layer and the metallic tin layer are formed, for example, by electroplating.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
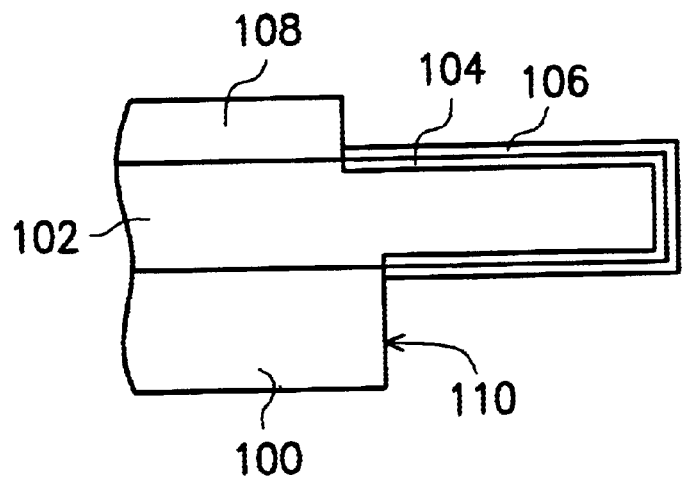
FIG. 1 is a sectional view of a conventional tape structure.
Figure 2:
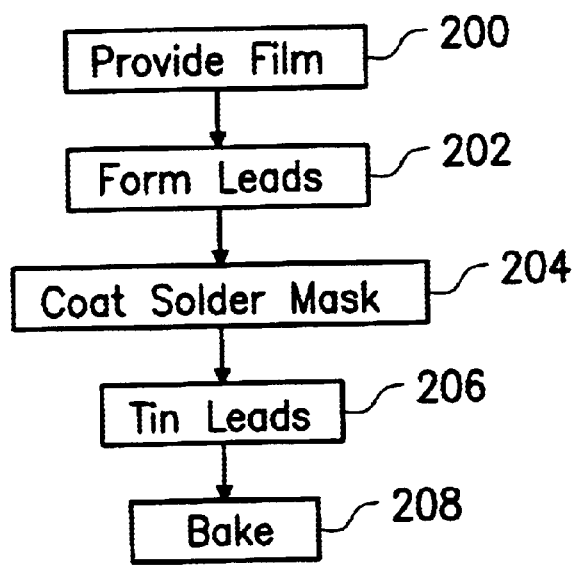
FIG. 2 is a flow chart showing the steps for producing the tape as shown in FIG. 1.
Figure 3:
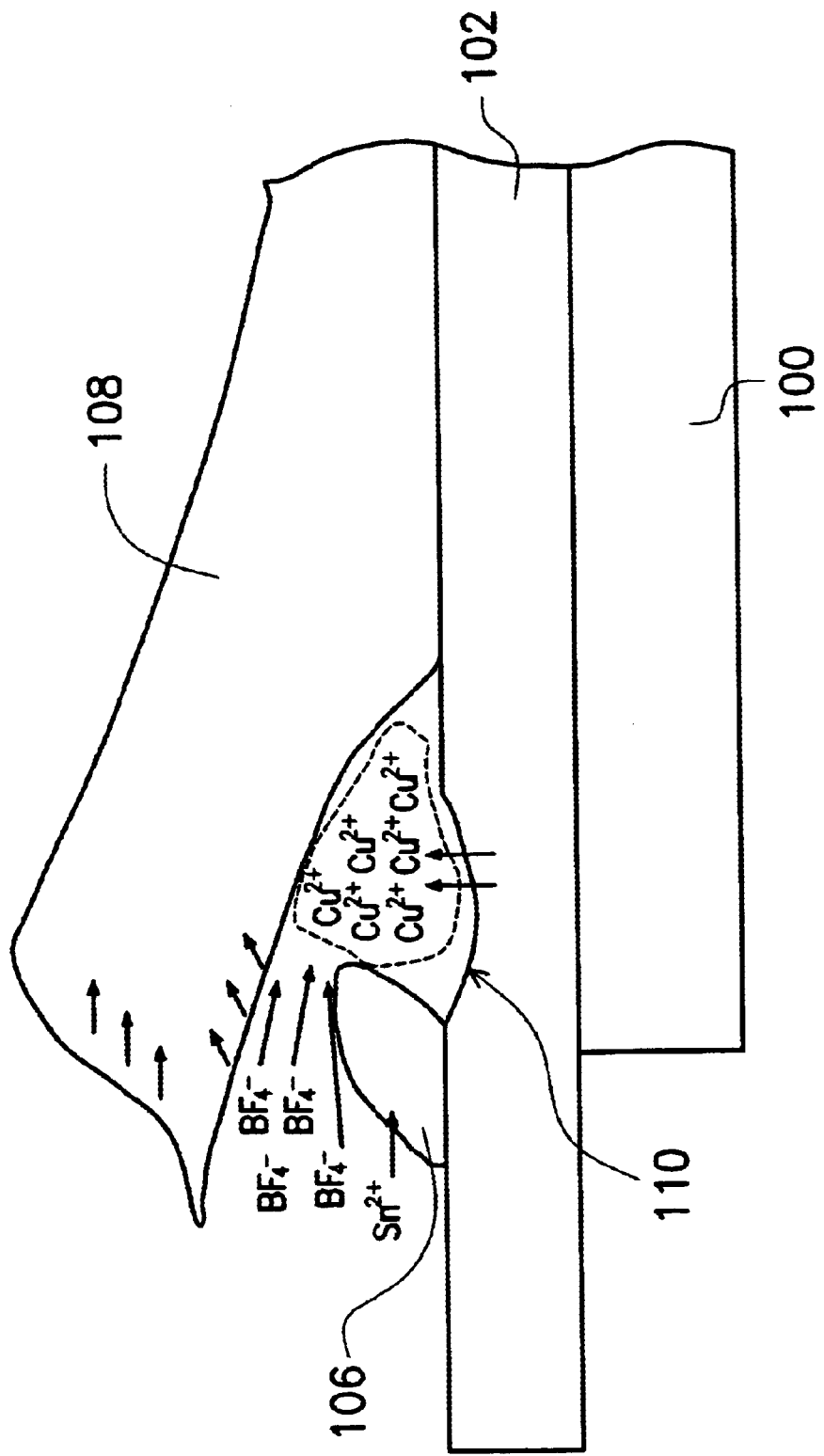
FIG. 3 is a sectional view showing the emergence of a recess cavity in a conventional tape lead after a tinning operation due to corrosion.
Figure 4:
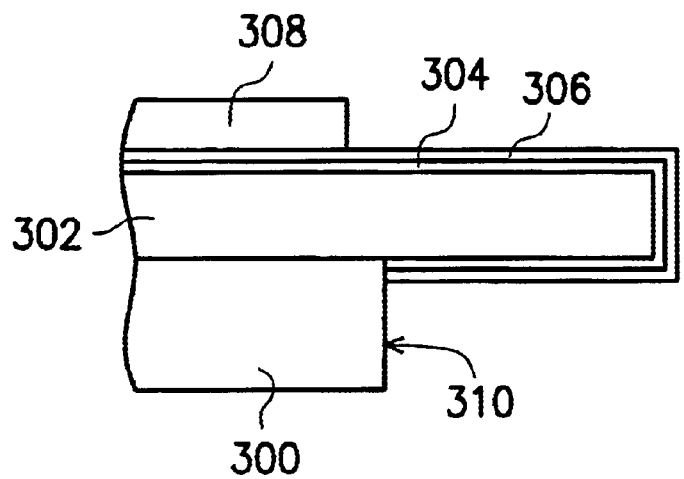
FIG. 4 is a sectional view of another conventional tape structure.
Figure 5:
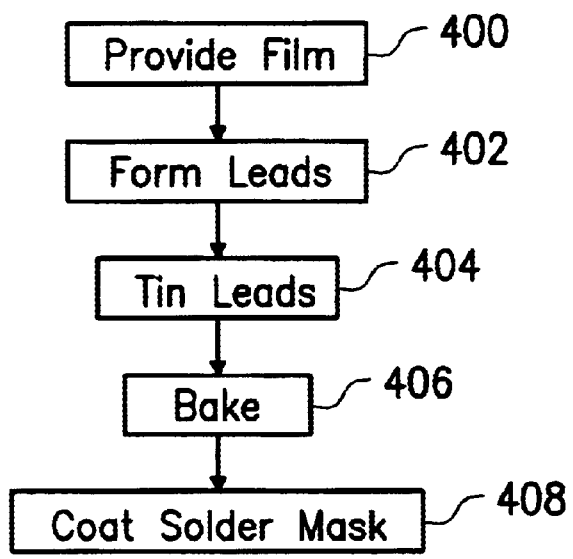
FIG. 5 is a flow chart showing the steps for producing the tape as shown in FIG. 4.
Figure 6:
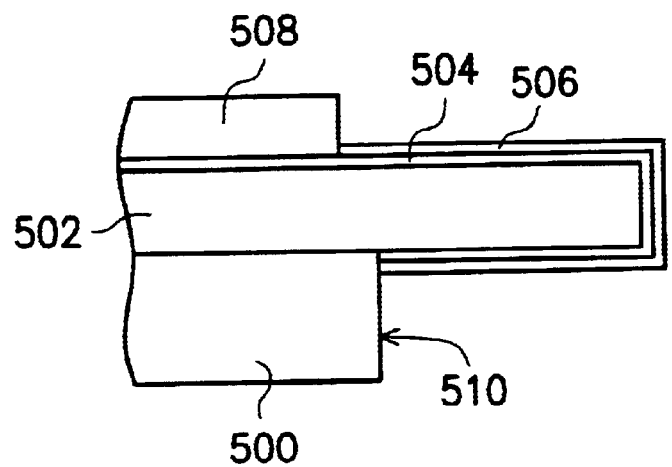
FIG. 6 is a sectional view of yet another conventional tape structure.
Figure 7:
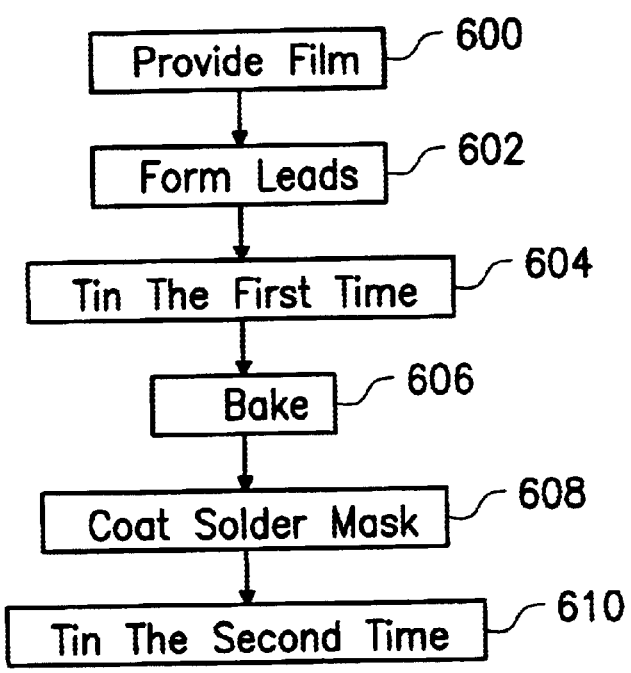
FIG. 7 is a flow chart showing the steps for producing the tape as shown in FIG. 6.

Reference will now be made in detail to the present preferred embodiments of the invention, examples of which are illustrated in the accompanying drawings. Wherever possible, the same reference numbers are used in the drawings and the description to refer to the same or like parts.

A tape carrier package (TCP) supports a silicon chip mainly through a tape structure. The silicon chip is connected to inner leads using an inner lead bonding (ILB) technique. Thereafter, a portion of the tape and the silicon chip is enclosed inside a plastic package. In the process of forming the package, any whiskers on the surface of leads increase the likelihood of forming short-circuit paths with the chip. Furthermore, any recess cavities on the leads also increase the likelihood of having a broken lead causing reliability problems for the package. Hence, the tape (inner leads or outer leads) should have as few whiskers and recess cavities on the leads as possible.

Figure 8:
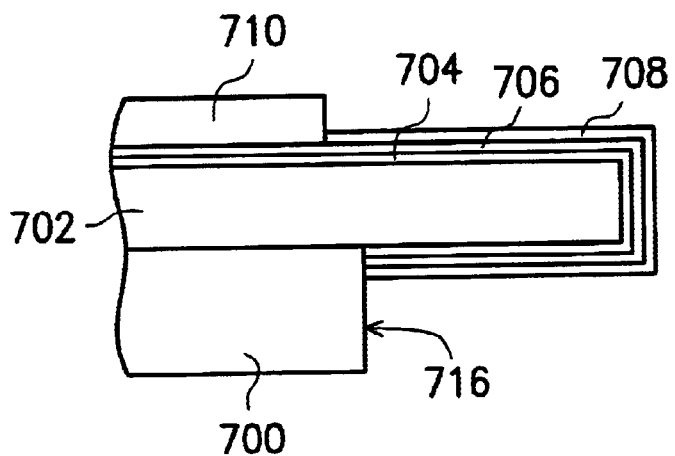
FIG. 8 is a sectional view of a tape structure fabricated according to a first preferred embodiment of this invention.

FIG. 8 is a sectional view of a tape structure fabricated according to a first preferred embodiment of this invention. The tape is built upon a film 700 having a plurality of device holes 716. The film 700 is made, for example, from polyimide. There are a plurality of leads 702 between the film 700 and a solder mask layer 710. The leads 702 extend from the film 700 into the interior of the device holes 716. The solder mask layer 710 is made from epoxy resin and the leads 702 are made from copper, for example. A tin-copper alloy layer 704 is formed over the surface of the leads 702. However, there is no tin-copper alloy layer 704 at the junction interface between the lead 702 and the film 700. A tin-copper-silver alloy layer 706 is formed over the surface of the tin-copper alloy layer 704.

As shown in FIG. 8, a metallic tin layer 708 covers the tin-copper-silver alloy layer 706. However, there is no metallic tin layer 708 at the junction interface between the tin-copper-silver alloy layer 706 and the film 700 as well as between the tin-copper-silver alloy layer 706 and the solder mask layer 710. In other words, a portion of the tin-copper alloy layer 704 and the tin-copper-silver alloy layer 706 is sandwiched between the leads 702 and the solder mask layer 706 while the metallic tin layer 708 is excluded.

Figure 9:
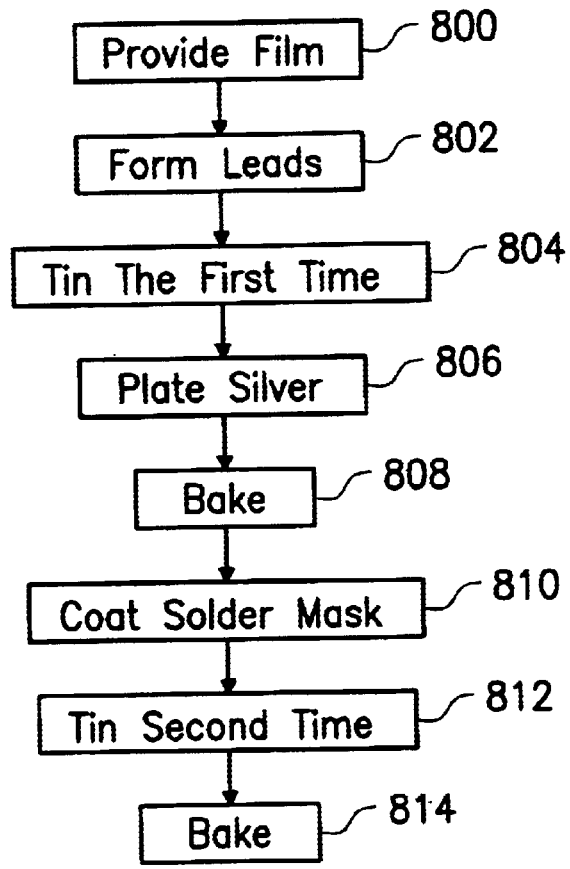
FIG. 9 is a flow chart showing the steps for producing the tape as shown in FIG. 8.

FIG. 9 is a flow chart showing the steps for producing the tape as shown in FIG. 8. As shown in FIG. 9, the manufacturing process includes providing a film (800), forming the leads (802), conducting a first tinning operation (804), conducting a silver-coating operation (806), baking (808), coating a solder mask layer (810), conducting a second tinning operation (812), and baking (814).

To fabricate the tape structure, a film 700 is provided in step 800. The film 700 with a tape profile has a plurality of device holes 716 therein. Leads 702 are formed in step 802. To form the leads 702, a copper film is pressed onto the film 700 and patterned by conducting photolithographic and etching processes. A first tinning operation is carried out to tin the leads 702 in step 804. In the tinning operation, the exposed lead surface is, for example, electroplated to form a metallic tin layer over the leads 702 so that the leads 702 have a metallic tin layer thereon aside from the junction interface between the leads 702 and the film 700. The metallic tin layer has a thickness between about 0.15 μm to 0.20 μm.

A silver-coating operation is carried out in step 806. In the silver-coating operation, a layer of metallic silver is formed over the metallic tin layer, for example, by electroplating. The solution for electroplating silver over the metallic tin layer can be potassium silver cyanide ($KAg(CN)_2$) having a concentration of about 20 grams/liter (g/L), for example. The electroplating operation is conducted continuously for about 20 seconds.

A baking operation is carried out in step 808 so that a tin-copper alloy layer 704 and a tin-copper-silver alloy layer 706 are formed on the surface of the leads 702. The baking operation is conducted continuously for 1 hour at a temperature of about 150° C.

A solder mask 710 is formed over the film 700 in step 810. Thereafter, a second tinning operation is carried out to form a metallic tin layer 708 in step 812. For example, the metallic tin layer 708 is formed on the exposed surface of the tin-copper-silver alloy layer 706 by electroplating. The metallic tin layer 708 has a thickness between about 0.25 μm to 0.35 μm. Another baking operation is carried out for 1 hour at a temperature of about 150° C. in step 814. The second baking operation reduces the thickness of the metallic thin layer 708 to between about 0.15 μm to 0.20 μm.

Figure 10:
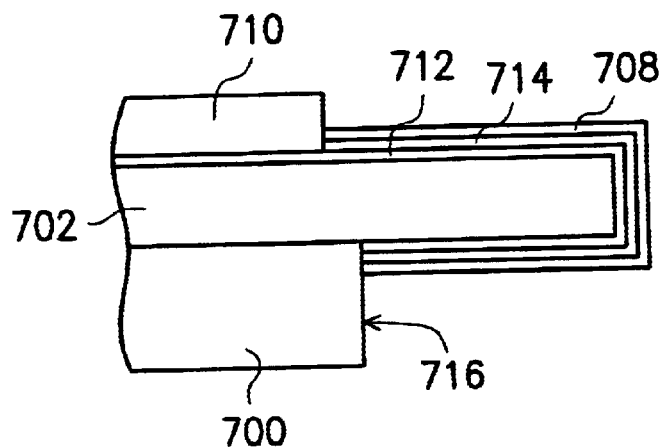
FIG. 10 is a sectional view of a tape structure fabricated according to a second preferred embodiment of this invention.

FIG. 10 is a sectional view of a tape structure fabricated according to a second preferred embodiment of this invention. The tape is built upon a film 700 having a plurality of device holes 716. The film 700 is made, for example, from polyimide. There are a plurality of leads 702 between the film 700 and a solder mask layer 710. The leads 702 extend from the film 700 into the interior of the device holes 716. The solder mask layer 710 is made from epoxy resin and the leads 702 are made from copper, for example. A copper-silver alloy layer 712 is formed over the surface of the leads 702. However, there is no copper-silver alloy layer 712 at the junction interface between the lead 702 and the film 700.

As shown in FIG. 10, a tin-copper-silver alloy layer 714 covers the copper-silver alloy layer 712. However, there is no tin-copper-silver alloy layer 714 at the junction interface between the copper-silver alloy layer 712 and the film 700 as well as between the copper-silver alloy layer 712 and the solder mask layer 710. In addition, a metallic tin layer 708 covers the tin-copper-silver alloy layer 714. In other words, a portion of the copper-silver alloy layer 712 is sandwiched between the leads 702 and the solder mask layer 710 while the tin-copper-silver alloy layer 714 and the metallic tin layer 708 are excluded.

Figure 11:
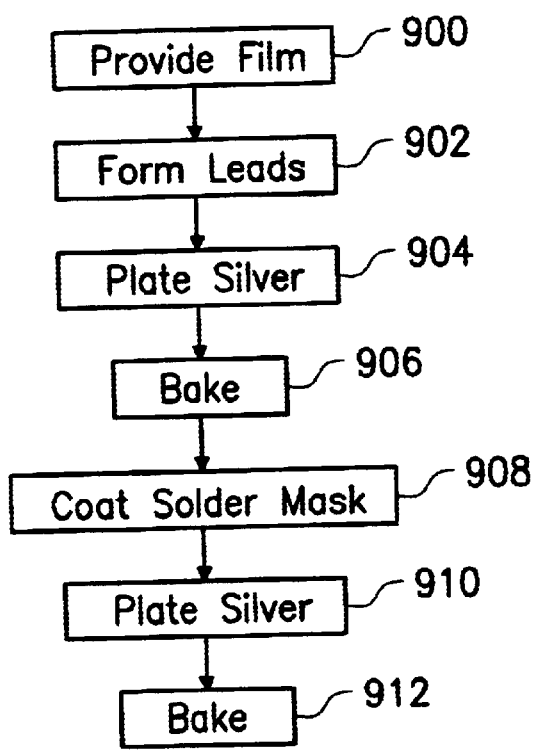
FIG. 11 is a flow chart showing the steps for producing the tape as shown in FIG. 10.

FIG. 11 is a flow chart showing the steps for producing the tape as shown in FIG. 10. As shown in FIG. 11, the manufacturing process includes providing a film (900), forming the leads (902), conducting a silver-coating operation (904), baking (906), coating a solder mask layer (908), conducting a tinning operation (910), and baking (912).

To fabricate the tape structure, a film 700 is provided in step 900. The film 700 with a tape profile has a plurality of device holes 716 therein. Leads 702 are formed in step 902. To form the leads 702, a copper film is pressed onto the film

700 and patterned by conducting photolithographic and etching processes.

A silver-coating operation is carried out in step 904. In the silver-coating operation, a layer of metallic silver is formed over the leads 702, for example, by electroplating. The solution for electroplating silver over the metallic tin layer can be potassium silver cyanide (KAg(CN)$_2$) having a concentration of about 20 grams/liter (g/L), for example. The electroplating operation is conducted continuously for about 20 seconds.

A baking operation is carried out in step 906 so that a copper-silver alloy layer 714 is formed on the surface of the leads 702. A solder mask 710 is formed over the film 700 in step 908. Thereafter, a tinning operation is carried out to form a metallic tin layer 708. For example, the metallic tin layer 708 is formed on the exposed surface of the copper-silver alloy layer 712 by electroplating. Another baking operation is carried out for 1 hour at a temperature of about 150° C. in step 912. The second baking operation produces a tin-copper-silver alloy layer 714 between the metallic tin layer 708 and the copper-silver alloy layer 712.

To simplify explanation, silver metal is chosen in the aforementioned embodiments. The metallic material that can be used is not limited to silver. Other metals such as bismuth, gold, magnesium, nickel, or palladium may replace the silver in the copper-silver alloy layer 712 or the tin-copper-silver alloy layer 706.

In conclusion, the tape structure and fabricating method according to this invention has at least the following advantages:

1. The likelihood of having recess cavities on the leads of a tape is greatly reduced.
2. The likelihood of having whiskers on lead surface is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tape structure, comprising:
    a film having at least one device hole therein;
    a solder mask over the film; and
    a plurality of leads between the film and the solder mask, wherein the leads extend from the film into the interior of the device holes, the leads are made from copper and the leads further include:
        a tin-copper alloy layer on the surface extending beyond the junction interface between the leads and the film and in between the leads and the solder mask;
        a tin-copper-first metal alloy layer on the surface of the tin-copper alloy layer extending between the leads and the solder mask, wherein the first metal is selected from a group consisting of gold, magnesium, and palladium; and
        a metallic till layer on the surface of the tin-copper-first metal alloy layer extending beyond both the junction interface between the tin-copper-first metal alloy layer and the solder mask and the junction interface between the leads and the film.

2. The tape structure of claim 1, wherein material constituting the film includes polyimide.

3. The tape structure of claim 1, wherein material constituting the solder mask includes epoxy resin.

4. A tape structure, comprising:
    a film having at least one device hole therein;
    a solder mask over the film; and
    a plurality of leads between the film and the solder mask, wherein the leads extend from the film into the interior of the device holes, the leads are made from copper and the leads further include:
        a tin-first metal alloy layer on the surface extending beyond the junction interface between the leads and the film and in between the leads and the solder mask, wherein the first metal is selected from a group consisting of gold, magnesium, and palladium;
        a tin-copper-first metal alloy layer on the surface of the tin-first metal alloy layer extend beyond both the junction interface between the first metal alloy layer and the solder mask and the junction interface between the leads and the film; and
        a metallic tin layer on the surface of the tin-copper-first metal alloy layer.

5. The tape structure of claim 4, wherein material constituting the film includes polyimide.

6. The tape structure of claim 4, wherein material constituting the solder mask includes epoxy resin.

* * * * *